United States Patent [19]
Mellitz

[11] Patent Number: 5,498,965
[45] Date of Patent: Mar. 12, 1996

[54] DRIVING POINT REFERENCE PLANE TIME DOMAIN REFLECTOMETRY METHOD FOR MEASURING CHARACTERISTIC IMPEDANCE

[75] Inventor: Richard I. Mellitz, Pepperell, Mass.

[73] Assignee: Digital Equipment Corporation, Maynard, Mass.

[21] Appl. No.: 167,381

[22] Filed: Dec. 15, 1993

[51] Int. Cl.⁶ ............................................... G01R 31/08
[52] U.S. Cl. ............................................................ 324/532
[58] Field of Search ................................ 324/532, 535, 324/522, 543, 544, 539, 541, 551

[56] References Cited

U.S. PATENT DOCUMENTS

| | | | |
|---|---|---|---|
| 4,739,276 | 4/1988 | Graube | 324/534 |
| 4,887,041 | 12/1989 | Mashikian et al. | 324/533 |
| 4,970,466 | 4/1990 | Bolles et al. | 324/533 |
| 5,063,353 | 11/1991 | Gubisch | 324/710 |
| 5,128,619 | 7/1992 | Bjork et al. | 324/533 |

OTHER PUBLICATIONS

Application Note 62: TDR Fundamentals, For Use With HP 54120T Digitizing Oscilloscope and TDR, Hewlett Packard, Apr. 1988.

Primary Examiner—Maura K. Regan
Attorney, Agent, or Firm—Krishnendu Gupta; Ronald C. Hudgens; Arthur W. Fisher

[57] ABSTRACT

Method for determining the characteristic impedance of a transmission line on a printed wiring board using time domain reflectometry. The method involves selecting a driving point in time, selecting an undisturbed interval, measuring voltage at predetermined time intervals across the undisturbed interval, determining from the measured voltages a curve representative of such voltages, and determining the voltage on the representative curve at the driving point. The characteristic impedance of the transmission line under test, denoted by $Z_0$, is obtained by using the "driving point" of the transmission line as the reference plane for the impedance measurements.

13 Claims, 9 Drawing Sheets

DRIVING POINT REFERENCE PLANE TIME DOMAIN REFLECTOMETRY METHOD FOR MEASURING CHARACTERISTIC IMPEDANCE

BACKGROUND OF THE INVENTION

Advancements in semiconductor devices and packaging technology has been a principal agent of change in printed wiring board (PWB) technology. To extract maximum system performance, the characteristic impedance of transmission lines on a PWB must match that of the semiconductor devices mounted on it in order to prevent signal reflection or ringing which can cause distortion of digital signals between devices on a PWB.

Impedance is a property of all conductors and refers to the resistance to the flow of electrical current in a conductor pair when voltage is applied across the pair. Characteristic impedance is a material dependent parameter that is indicative of the high frequency behavior of a PWB. Characteristic impedance has an expanding role in modern electronics due to increasing logic and system speeds. Characteristic impedance of a transmission line is primarily measured using time domain reflectometry (TDR) techniques.

When using TDR techniques to measure characteristic impedance the units of measure are derived and not directly measured. The accuracy of such measurements can not be directly traced to NIST (the National Institute of Standards and Technology). Therefore, accuracy and repeatability of characteristic impedance measurements performed by using TDR techniques has been the subject of much research. TDR measurements often vary greatly depending on how the tests are performed.

In order to achieve repeatable and accurate measurements using TDR techniques, the electromagnetic losses of the line under measurement and the respective interconnections to the TDR instrumentation must be compensated for. Prior art methods don't compensate completely for these losses thereby, producing inaccurate results. One prior art method attempts to compensate for line loss by making DC resistance measurements. However, such an approach does not compensate for losses that result from the high frequency content of the signal used for TDR measurements. Another prior art method is described in U.S. Pat. No. 5,063,353.

SUMMARY OF THE INVENTION

The present invention is a method for determining the characteristic impedance of a transmission line on a printed wiring board using time domain reflectometry.

An object of the invention is accurate characteristic impedance measurements.

Another object of the invention is repeatable characteristic impedance measurements.

These and other objects are attained, through the use of various features of the invention. The invention comprises selecting a driving point in time, selecting an undisturbed interval, measuring voltage at predetermined time intervals across the undisturbed interval, determining from the measured voltages a curve representative of such voltages, and determining the voltage on the representative curve at the driving point. The characteristic impedance of the transmission line under test, denoted by $Z_0$, is obtained by using the "driving point" of the transmission line as the reference plane for the impedance measurements. The method of this invention differs from previous techniques by referencing all measurements to the "driving point" of the line.

It is an advantage of this invention that electromagnetic line losses can be eliminated from the measurement of characteristic impedance without having to separately identify the source of these losses.

It is another advantage of this invention to reduce scrap, and hence costs, in printed wiring board manufacture by accurately measuring impedance of transmission lines, thereby preventing boards with impedance values close to the high and low ends of the specified value from being inadvertently scrapped during testing due to measurement errors.

It is yet another advantage of this invention to provide accurate impedance data for engineering development of printed wiring boards that meet performance objectives.

It is another advantage of this invention to provide manufacturers of printed wiring boards accurate impedance data for effective process control and troubleshooting of board fabrication processes.

The foregoing and additional objects, features and advantages of the present invention will become apparent to those skilled in the art from a more detailed consideration of the invention, taken in conjunction with the accompanying drawings.

DETAILED DESCRIPTION OF THE INVENTION

Figure 1:
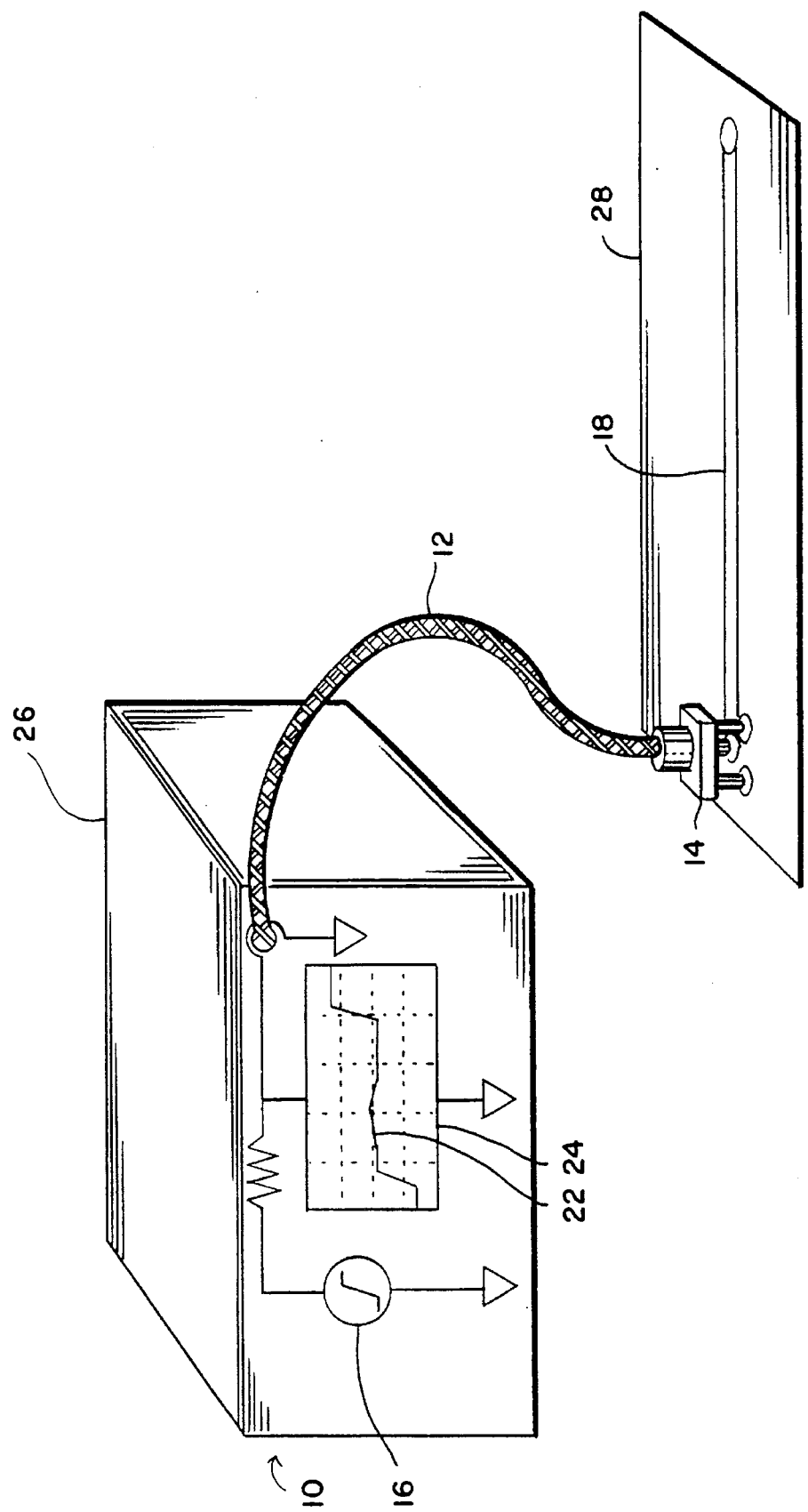
FIG. 1 is a schematic of a test set-up to perform an impedance measurement of a transmission line in a printed wiring board using time domain reflectometry according to the invention.

As shown in FIG. 1, the set up required to perform time-domain reflectometry (TDR) measurements includes a measurement instrument 10, which is essentially a step generator combined with a sampling oscilloscope, a cable 12 suitable for high frequency signal transmission, and a suitable probe 14 that is connected to the cable 12 during TDR measurements. The set up of FIG. 1 is used in conjunction with the method of this invention to determine the characteristic impedance of a line 18 on a printed wiring board (PWB) 28.

As shown in FIG. 1, the measurement instrument 10 is a Hewlett-Packard digitizing oscilloscope model HP54120. Other instruments such as Tektronix TEK7854 or TEK 11800 may also be used instead. As shown in FIG. 1, the probe 14 is a SMA PC mount connector having a 1.3 mm center pin with three of the four surrounding 1 mm square ground pins cut off to yield a convenient 2-prong probe for accurate measurements.

The time-domain reflectometer (TDR) 10 is a sampling oscilloscope with a built-in or plug-in step generator 16. The generator injects a positive going incident voltage step with a very short rise time, on the order of 30 picoseconds, into the transmission line 18 being tested. The incident voltage step is propagated down the transmission line 18 at the velocity of propagation of the line 18. Each location of physical perturbations on the line 18 causes an impedance mismatch on the line 18 resulting in a second wave, i.e., the reflected wave, to originate at the location of the mismatch at the time the incident voltage step reaches it and to propagate back up the line towards the source.

The incident and reflected voltage waves are monitored by the oscilloscope 10 at a particular point on the line, the oscilloscopes monitor point. The oscilloscope displays the superposition of incident and reflected voltage waves incident at the monitor point. The displayed voltage variation with time represented by the waveform 22 of FIG. 1 corresponds to reflections caused by the physical perturbations at different locations on the line 18. The time represented on the waveform 22 is twice the time required for the incident wave to reach that perturbation. This voltage reflection technique reveals the characteristic impedance of the line through interpretation of the reflected waveform 22.

As shown in FIGS. 3, 5, 7, 9 and 10 the TDR display screen 24 is calibrated vertically in volts. For the horizontal scale, the period of time between the launching of the step from the port 26 and the sensation of a reflection is measured and the display 24 is calibrated horizontally in time.

The characteristic impedance of the transmission line 18 under test, denoted by $Z_0$, is obtained by using the "driving point" of the transmission line 18 as the reference plane for the impedance measurements. The method of this invention differs from previous techniques by referencing all measurements to the "driving point" of the line. The "driving point" is defined as the instant of time denoted by $T_{reference\_point}$, and corresponds to a location at the beginning of the line 18. The following equation is used to determine characteristic impedance $Z_0$:

$$Z_0 = Z_{reference} \cdot \frac{V_{incident} + V_{line} - V_{reference}}{V_{incident} + V_{line} + V_{reference}}$$

Where, $V_{incident}$=voltage amplitude of the incident step a $T_{reference\_point}$;

$V_{line}$=voltage amplitude relative to the base of the incident step of the wavefront caused by the line's reflection at $T_{reference\_point}$;

$V_{reference}$=voltage amplitude relative to the base of the incident step of wavefront caused by a referee impedance standard at $T_{reference\_point}$;

$Z_{reference}$=Characteristic impedance of the referee impedance standard.

The amplitude of the step that is incident on the line under test 18 is not the same as the amplitude of the step emerging from the instruments port 26. A series of calibration steps compensates for this difference in amplitude. The calibration steps are used to determine $V_{incident}$, $V_{reference}$, and $T_{reference\_point}$. The calibration steps may be performed in any order. Good results have been obtained by using the following sequence of steps.

Figure 2:
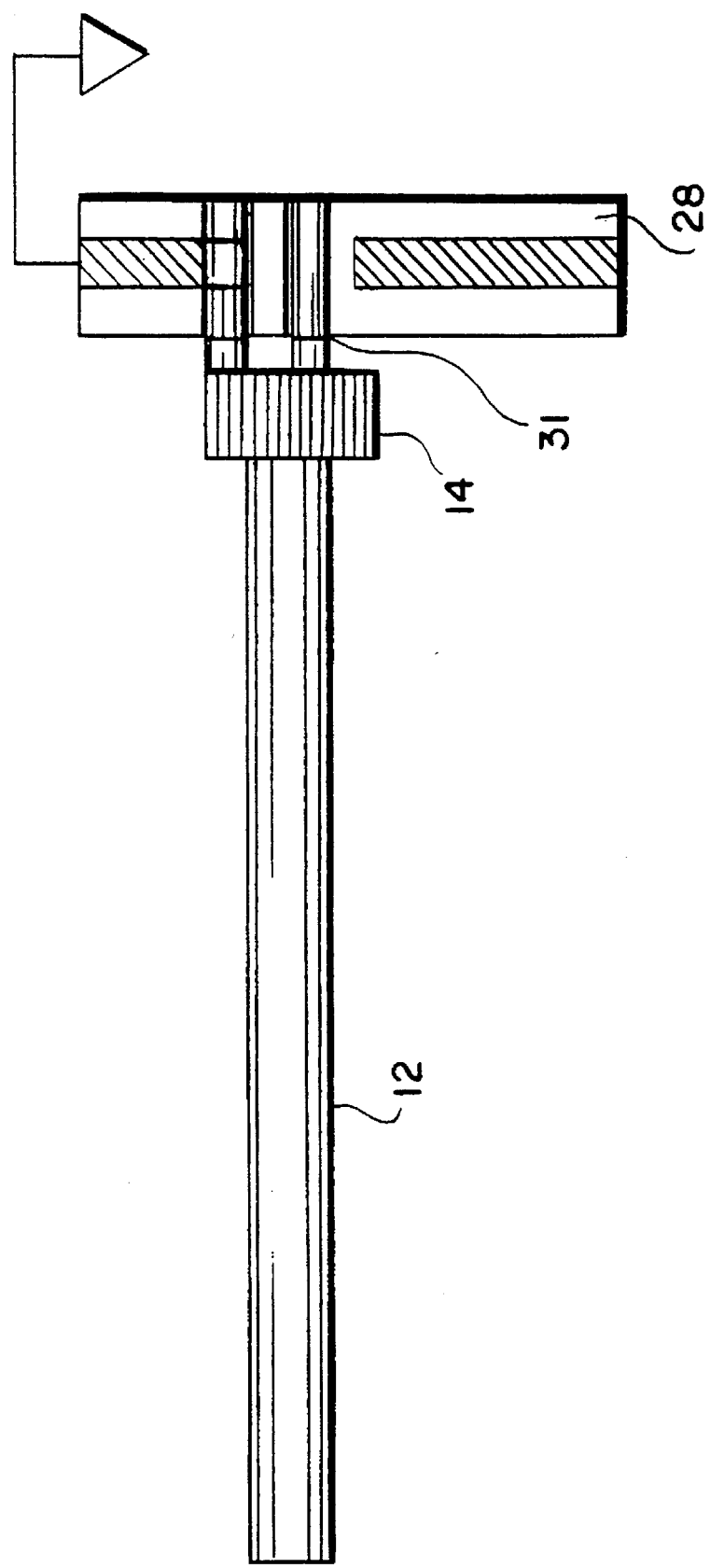
FIG. 2 is a schematic indicating the cable of FIG. 1 having a probe attached to it and connected to an open signal launch for the performance of the first and third calibration steps according to the invention.
Figure 3:
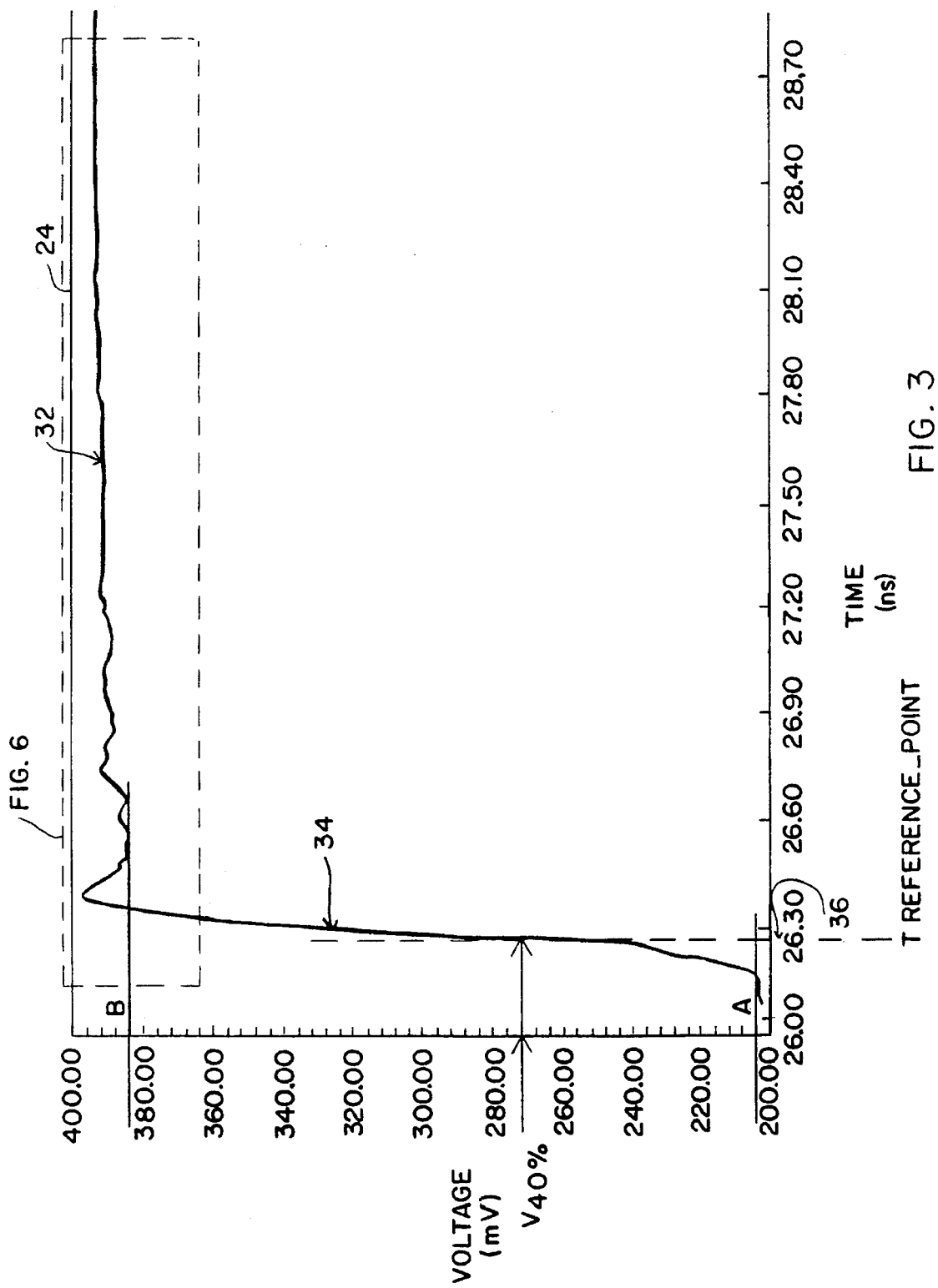
FIG. 3 shows a TDR screen displaying the waveform resulting from the connection of FIG. 2.

The first calibration step is performed to determine $T_{reference\_point}$. As shown in FIG. 2, this step involves connecting the probe 14 to a signal launch 31 that is on the PWB 28. The signal launch 31 could be a via on a PWB. The signal launch 31 selected for this step must be structurally the same as the signal launch 30 connected to the transmission line 18 under test. This signal launch 31 has no line attached to it and is also referred to as an open signal launch. After the probe 14 is inserted into the open signal launch 31 the incident step introduced by the TDR 10 encounters a discontinuity, that is, the end of the signal launch 31 and a reflected wave is caused to be sent back to the TDR. The composite of the reflected and incident waves is sensed by the TDR 10 and the resulting waveform 32 is displayed on the TDR display 24, as shown in FIG. 3.

$T_{reference\_point}$ is an instant in time that corresponds to a physical location at the end of the signal launch 31 where the line 18 begins. As shown in FIG. 3, $T_{reference\_point}$ is the point in time where the 40% voltage point ($V_{40}$) occurs on the rising edge 34 of the waveform 32. The 40% point ($V_{40}$) is defined to be the voltage where the voltage of the waveform is 40% of the voltage change from base to top of the rising edge 34. The base voltage ($V_{base}$) is indicated on FIG. 3 by 'A', while the top voltage ($V_{top}$) is indicated by 'B'. Hence, determining $T_{reference\_point}$ requires that the 40% voltage point ($V_{40}$) be determined first. As shown in FIG. 3, determining the 40% voltage point ($V_{40}$) comprises (i) determining a base voltage ($V_{base}$) and a top voltage ($V_{top}$) corresponding to the physical location denoting end of the signal launch and start of the transmission line; (ii) determining the difference between the top voltage ($V_{top}$) and the base voltage ($V_{base}$) by subtracting the base voltage from the top voltage ($V_{top}-V_{base}$); (iii) multiplying a predetermined factor, such as 0.40 to the difference between the voltages ($V_{top}-V_{base}$); and (iv) adding to ($V_{top}-V_{base}$) the base voltage ($V_{base}$). Hence, as explained above, the voltage at the 40% point ($V_{40}$) is determined by using the following equation:

$$V_{40} = V_{base} + 0.4(V_{top}-V_{base}).$$

The point in time corresponding to the occurrence of $V_{40}$ on the waveform 32 is determined from the display 24. As shown in FIG. 3, that point in time denotes $T_{reference\_point}$ 36.

Figure 4:
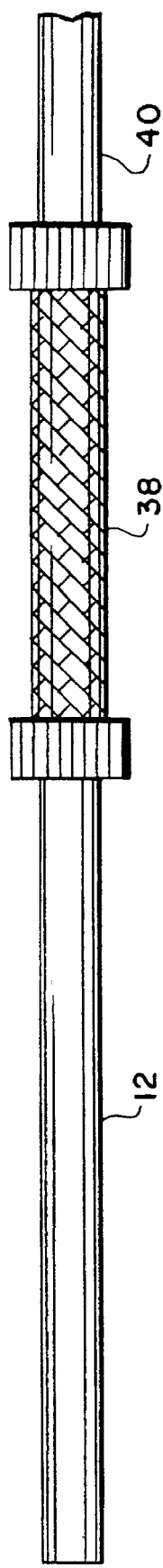
FIG. 4 is a schematic indicating the cable of FIG. 1 having a referee impedance standard attached to it and terminated by another cable for the performance of the second calibration step according to the invention.

The second calibration step is performed to determine $V_{reference}$. As shown in FIG. 4, for this calibration step, the probe 14 is removed and a referee impedance standard 38 is connected. The referee impedance standard 38 shown in FIG. 4 is a 50 ohm air dielectric coaxial rigid transmission line, also referred to as an air line. Other suitable referee impedance standards may be used instead. The reference impedance, $Z_{reference}$, the characteristic impedance of the referee impedance standard of FIG. 4 is therefore 50 ohms. As shown in FIG. 4, a second piece of coaxial cable 40, similar to coaxial cable 12, is used to terminate the referee impedance standard 38 by connecting one end of cable 40 to the referee impedance standard 38. The other end of the second coaxial cable 40 is left open. This ensures that conditions during calibration are similar to those during the measurement steps, since the line under test 18 is also left open. The electrical length of the second cable 40 should be greater than that of the referee impedance standard 38.

Figure 5:
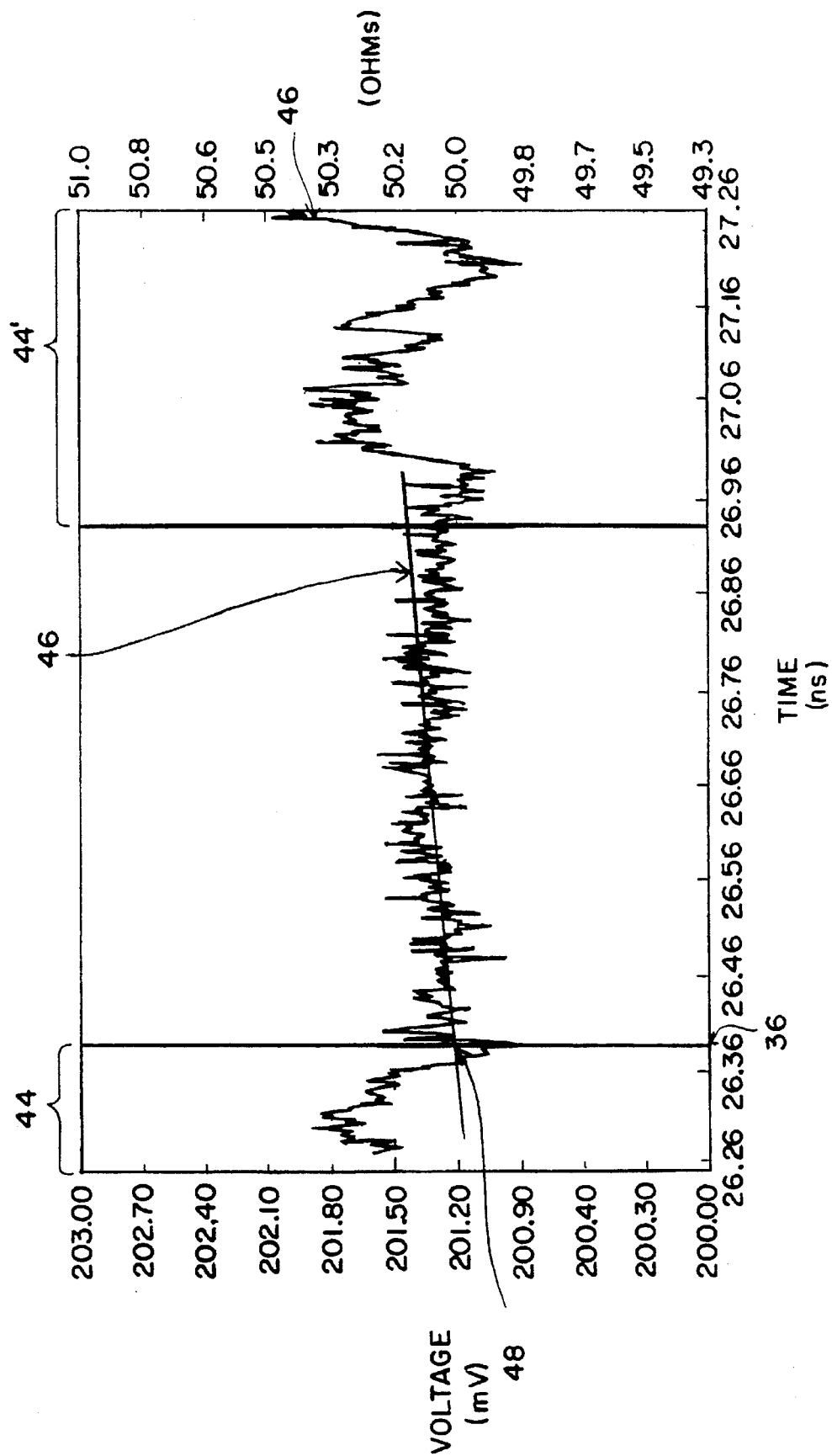
FIG. 5 shows a TDR screen displaying the waveform resulting from the connection of FIG. 4.

Once the proper connections have been made, as shown in FIG. 4, $V_{reference}$ is determined from the waveform 42 of FIG. 5. As shown in FIG. 5, regions 44 and 44' of the waveform 42 shows the effect of the connection of the coaxial cables 12 and 40 to the ends of the referee impedance standard 38. $V_{reference}$ is determined by using a method of curve fitting, such as least squares fit to fit a curve 46 to the region of the waveform 42 that corresponds to the referee impedance standard 38 and then interpolating the voltage value corresponding to time $T_{reference\_point}$ from the vertical scale of the display 24. As shown in FIG. 5, $V_{reference}$ 48 is the voltage at intersection of the least squares fit 46 and $T_{reference\_point}$ 36. Also as shown in FIG. 5, the curve of least squares fit 38 may be a straight line.

The third step in the calibration process is performed to determine $V_{incident}$. The set up for this step is the same as in the first calibration step and is also shown in FIG. 2. As shown in FIG. 2, the cable 12 is connected to a probe 14 and inserted into a signal launch 31.

Figure 6:
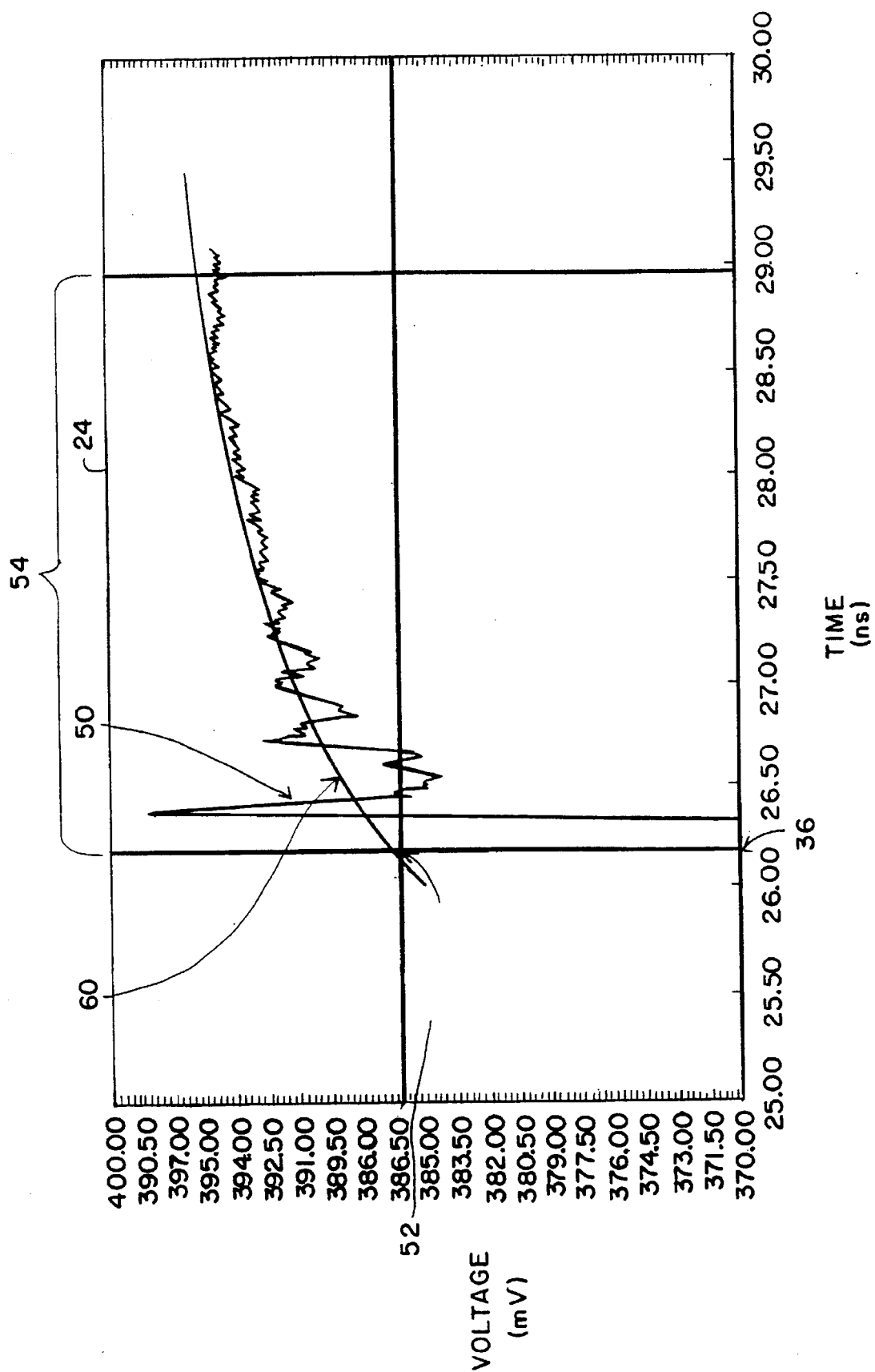
FIG. 6 shows a TDR screen displaying the portion of the waveform circled at the upper left hand corner of FIG. 3 resulting from the connection of FIG. 2, indicating the effect of an open termination at the open signal launch.

FIG. 6 shows the effect of the open termination at open signal launch 31. As shown in FIG. 6, the TDR display 24 shows waveform 50, the portion of the waveform 32 circled at the upper left hand corner of FIG. 3 resulting from the connection of FIG. 2, and indicates the effect of an open termination at the open signal launch 31. As shown in FIG. 6, waveform 50 has an open termination region 54. Using a curve fit method, such as the least squares method, a curve is fitted to the open termination region 54. As shown in FIG. 6, the fitted curve is indicated by reference numeral 60. The voltage 52 at the intersection of the curve 60 and $T_{reference\_point}$ 36 is defined as $V_{open}$. $V_{incident}$ is determined from the following equation:

$$V_{incident} = V_{open} - V_{reference}.$$

Having determined $V_{incident}$, $V_{reference}$, and $T_{reference\_point}$, the calibration process is complete. In order to determine the impedance of a line under test 18, a few measurement steps have to be performed.

Figure 7:
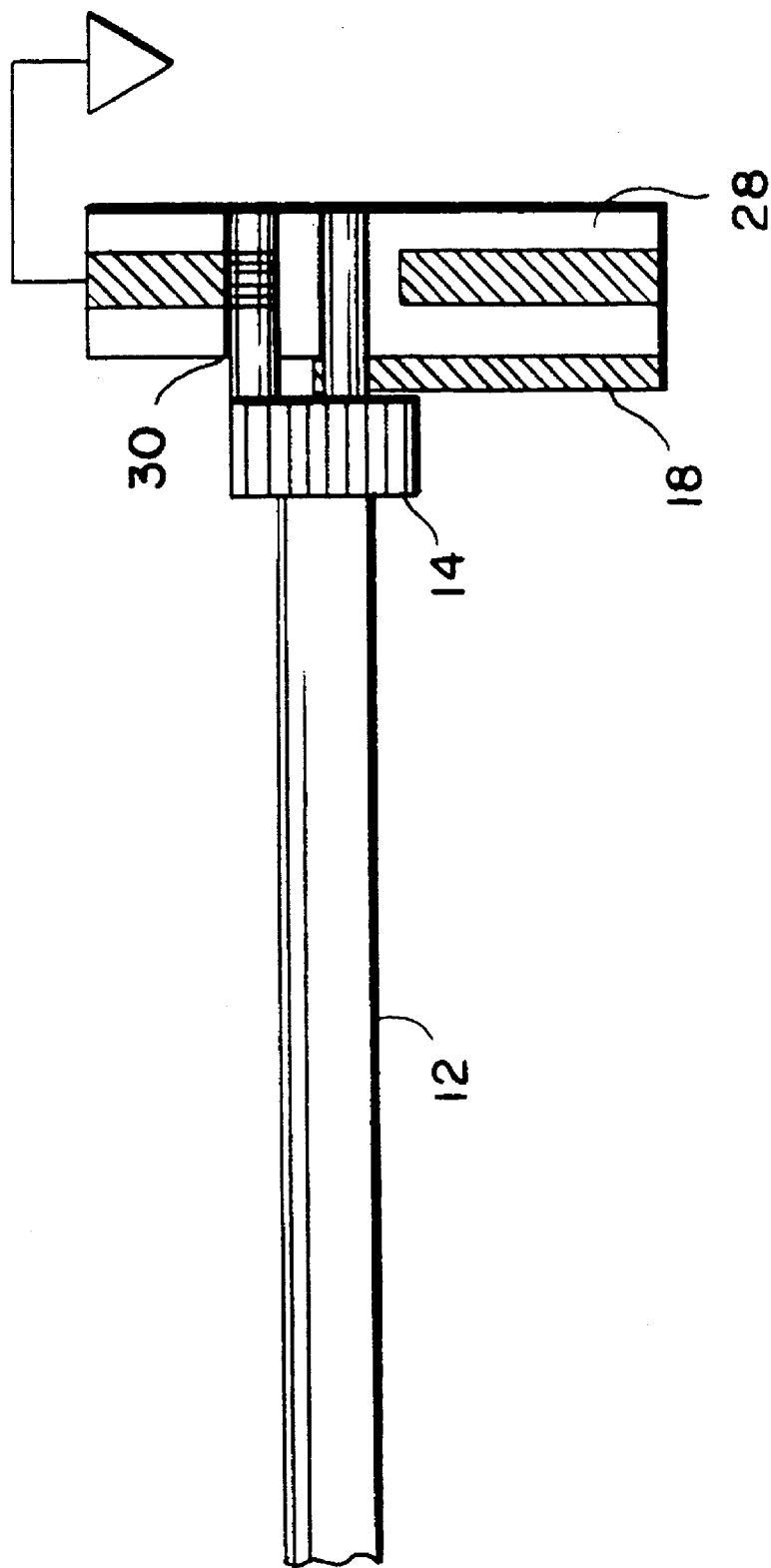
FIG. 7 is a schematic indicating the cable of FIG. 1 having a probe attached to it and inserted into a signal launch connected to the line under test for the performance of the first measurement step according to the invention.

As shown in FIG. 7, the set up for the measurement steps involves the insertion of probe 14 into signal launch 30 that is connected to the line under test 18.

Figure 8:
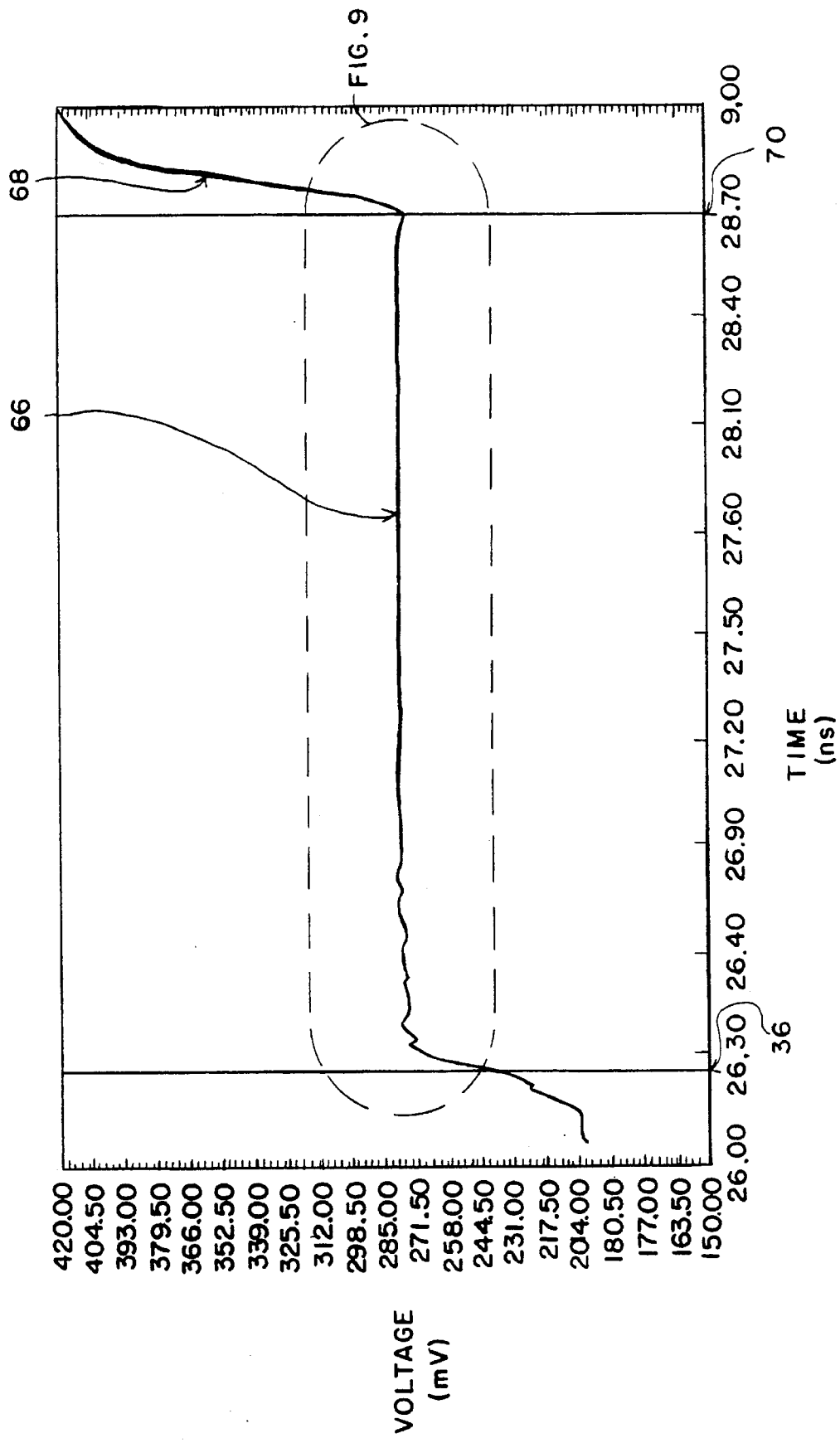
FIG. 8 shows a TDR screen displaying the waveform resulting from the connection of FIG. 7.

As shown in FIG. 8, the first measurement step involves determination of $T_{end\_line}$, the point of time when the reflection caused by the open termination at the end of the line 18 is observed at the TDR's 10 monitor point. The location of the end of line for waveform 66 is indicated in FIG. 8 by reference numeral 68. $T_{end\_line}$, indicated in FIG. 8 by reference numeral 70, the point in time where the end of line occurs, may be determined by noting the time from display 24 when the inflection denoted by 68 occurs on waveform 66. Alternatively it could also be derived from mathematical analysis as well.

Figure 9:
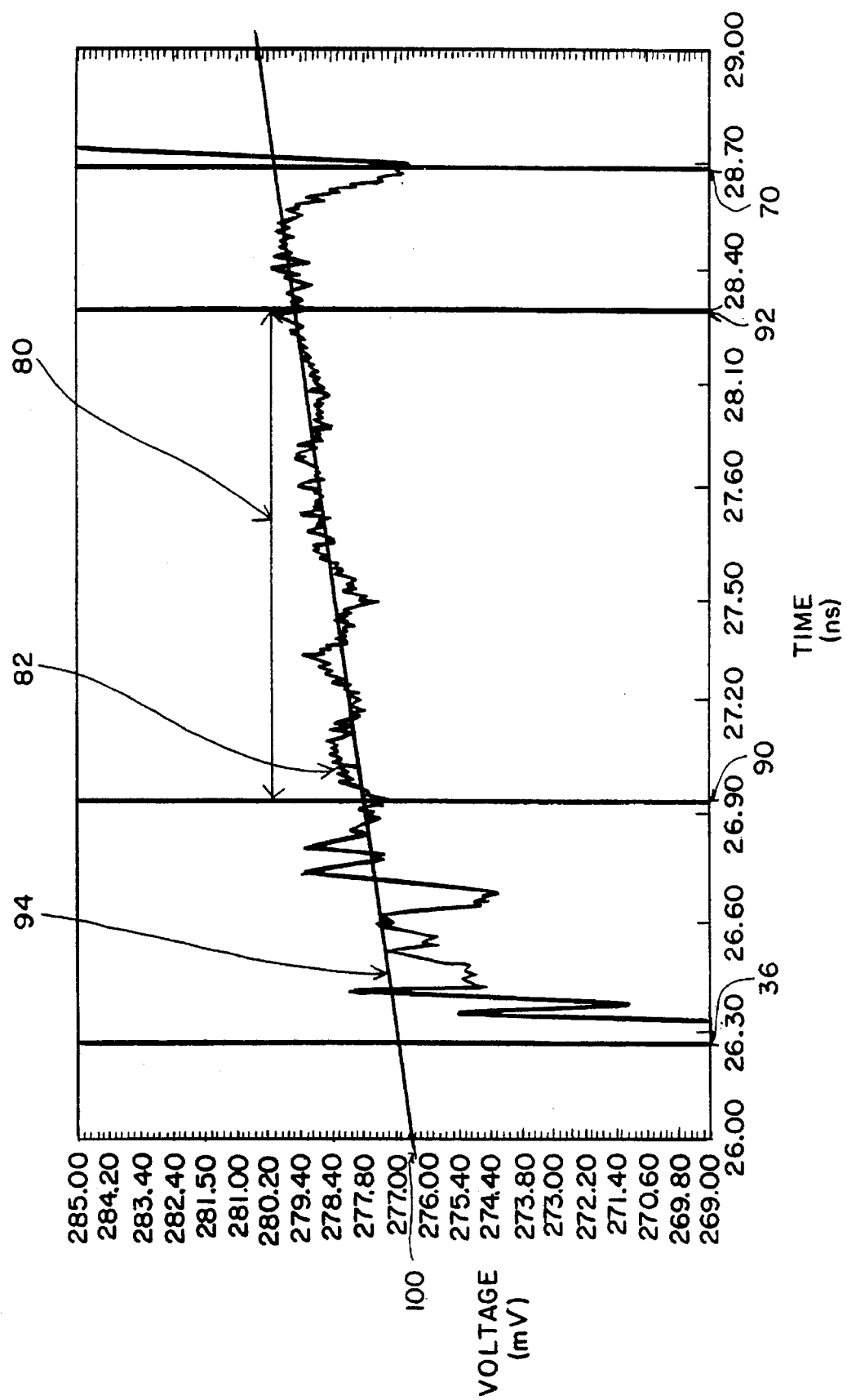
FIG. 9 shows a TDR screen displaying the portion of the waveform circled in the central region of FIG. 8, indicating the undisturbed region having a curve of best fit extended through it to the driving point for the determination of $V_{line}$.

Having determined $T_{end\_line}$ 70 and $T_{reference\_point}$ 36, the next measurement step involves the determination of the "undisturbed interval" 80 as shown in FIG. 9. The "undisturbed interval" 80 is defined as a predetermined interval contained within the time interval between $T_{end\_line}$ 70 and $T_{reference\_point}$ 36. Any time interval between $T_{end\_line}$ 70 and $T_{reference\_point}$ 36 can be used as an "undisturbed interval" to practice the applicants invention. As shown in FIG. 9, good results were obtained by using as an undisturbed interval 80, the section of the waveform 82 starting from a point of time 90, which is equal to $T_{reference\_point}$ plus a predetermined factor such as 0.25 times the difference between $T_{end\_line} - T_{reference\_point}$, and extending to a point of time 92, which is equal to $T_{reference\_point}$ plus a predetermined factor such as 0.85 times the difference between $T_{end\_line} - T_{reference\_point}$.

Hence, as shown in FIG. 9 and as explained above, the lower bound 90 of the undisturbed interval 80 is equal to $T_{reference\_point} + 0.25 \, (T_{end\_line} - T_{reference\_point})$, and the upper bound 92 of the undisturbed interval 80 is equal to $T_{reference\_point} + 0.85 \, (T_{end\_line} - T_{reference\_point})$.

As shown in FIG. 9, having determined the undisturbed interval 80, the next step of the measurement process involves fitting a line or a curve to the undisturbed interval 80. One such line is indicated in FIG. 9 by reference numeral 94. This line of fit 94 is next intrapolated to $T_{reference\_point}$ 36 to determine the voltage 100 from the left vertical scale of the display 24. This voltage 100 is $V_{line}$, the voltage amplitude relative to the base of the incident step of the wavefront caused by the line's reflection at $T_{reference\_point}$.

Having measured $V_{line}$, $V_{incident}$, $V_{reference}$ and given $Z_{reference}$, the characteristic impedance, $Z_0$, may be determined by substituting back into the equation below:

$$Z_0 = Z_{reference} \frac{V_{incident} + V_{line} - V_{reference}}{V_{incident} + V_{line} + V_{reference}}$$

The method that is described above was used for determining the characteristic impedance of a transmission line using time domain reflectometry on a printed wiring board. It will be apparent to those skilled in the art that various modifications and variations can be made in the steps of the method of the present invention to determine the characteristic impedance of transmission lines generally using time domain reflectometry. The steps of the method of the invention could be coded in software and a the calibration and measurement steps could be automated. Thus, it is intended that the specification and drawings be considered as exemplary only, with the true scope and spirit of the invention being indicated by the following claims.

We claim:

1. A method for determining the characteristic impedance of a transmission line using time domain reflectometry on a printed wiring board comprising the steps of:

(a) selecting a driving point, the step of selecting a driving point further comprising determining an instant in time on a time domain reflectometry (TDR) waveform established while probing an open signal launch, the driving point being the instant in time and corresponds to a physical location denoting end of the signal launch;

(b) measuring the amplitude of an incident voltage step at the driving point;

(c) measuring the amplitude of a voltage step caused by a referee impedance standard of known characteristic impedance at the driving point;

(d) selecting an undisturbed interval on a time domain reflectometry (TDR) waveform established while probing a transmission line;

(e) measuring voltage at predetermined time intervals across the undisturbed interval;

(f) determining from the measured voltages a curve representative of such voltages;

(g) determining a voltage on the representative curve at the driving point;

(h) calculating the characteristic impedance of the transmission line by substituting the voltage determined in step (g) in the following equation:

$$Z_0 = Z_{reference} \frac{V_{incident} + V_{line} - V_{reference}}{V_{incident} + V_{line} + V_{reference}}$$

where $V_{incident}$ the voltage measured in step (b), $V_{line}$ is the voltage determined in step (g), $V_{reference}$ is the voltage measured in step (c), $Z_{reference}$ is the characteristic impedance of the referee impedance standard.

2. The method of claim 1 wherein the step of selecting a driving point comprises determining a base voltage and a top voltage corresponding to the physical location denoting end of the signal launch; determining the difference between the top voltage and the base voltage by subtracting the base voltage from the top voltage; determining a voltage value by multiplying a predetermined factor to the difference between the voltages and adding the base voltage; determining the instant in time corresponding to the voltage value.

3. The method of claim 1 wherein the step of selecting the undisturbed interval comprises determining an instant in time indicating end of the transmission line; and selecting an interval of time within the driving point and the time indicating end of the transmission line as the undisturbed interval.

4. The method of claim 3 wherein the step of selecting an interval of time within the driving point and the time indicating end of the transmission line as the undisturbed interval comprises selecting the driving point plus a predetermined factor times the difference between the instant in time indicating end of the transmission line and the driving point as a starting point for said undisturbed interval and selecting the driving point plus another predetermined factor times the difference between the instant in time indicating end of the transmission line and the driving point as an end point of the undisturbed interval.

5. The method of claim 1 wherein the step of determining from the measured voltages a curve representative of such voltages comprises fitting a curve to the measured voltages.

6. The method of claim 1 wherein the step of determining a voltage on the representative curve at the driving point comprises interpolating to the driving point the representative curve. start of the transmission line comprises determining a base voltage and a top voltage corresponding to the physical location denoting end of the signal launch and start of the transmission line; determining the difference between the top voltage and the base voltage by subtracting the base voltage from the top voltage; determining a voltage value by multiplying a predetermined factor to the difference between the voltages and adding the base voltage; determining the instant in time corresponding to the voltage value.

7. A method for determining the characteristic impedance of a transmission line using time domain reflectometry on a printed wiring board comprising the steps of:

(a) connecting an oscilloscope to one end of a cable and a probe to another end of said cable;

(b) probing an open signal launch;

(c) establishing a time domain reflectometry (TDR) waveform in time of superposed incident and reflected voltage steps while probing the open signal launch;

(d) selecting a driving point from said TDR waveform, the driving point being the instant in time and corresponds to a physical location denoting end of the signal launch;

(e) measuring the amplitude of an incident voltage step at the driving point;

(f) measuring the amplitude of a voltage step caused by a referee impedance standard of known characteristic impedance at the driving point;

(g) probing a signal launch connected to the transmission line;

(h) establishing a TDR waveform in time of superposed incident and reflected voltage steps while probing the transmission line;

(i) selecting an undisturbed interval on the waveform of step (h);

(j) measuring voltage at predetermined time intervals across the undisturbed interval;

(k) determining from the measured voltages a curve representative of such voltages;

(l) determining a voltage on the representative curve at the driving point;

(m) calculating the characteristic impedance of the transmission line by substituting the voltage determined in step (l) in the following equation:

$$Z_0 = Z_{reference} \frac{V_{incident} + V_{line} - V_{reference}}{V_{incident} + V_{line} + V_{reference}}$$

where $V_{incident}$ the voltage measured in step (e), $V_{line}$ is the voltage determined in step (l), $V_{reference}$ is the voltage measured in step (f), $Z_{reference}$ is the characteristic impedance of the referee impedance standard.

8. The method of claim 7 wherein the step of selecting a driving point comprises determining a base voltage and a top voltage corresponding to the physical location denoting end of the signal launch and start of the transmission line; determining the difference between the top voltage and the base voltage by subtracting the base voltage from the top voltage; determining a voltage value by multiplying a predetermined factor to the difference between the voltages and adding the base voltage; determining the instant in time corresponding to the voltage value.

9. The method of claim 7 wherein the step of selecting the undisturbed interval comprises determining an instant in time indicating end of the transmission line; and selecting an interval of time within the driving point and the time indicating end of the transmission line as the undisturbed interval.

10. The method of claim 9 wherein the step of selecting an interval of time within the driving point and the time indicating end of the transmission line as the undisturbed interval comprises selecting the driving point plus a predetermined factor times the difference between the instant in time indicating end of the transmission line and the driving point as a starting point for said undisturbed interval and selecting the driving point plus another predetermined factor times the difference between the instant in time indicating end of the transmission line and the driving point as an end point of the undisturbed interval.

11. The method of claim 7 wherein the step of determining from the measured voltages a curve representative of such voltages comprises fitting a curve to the measured voltages.

12. The method of claim 7 wherein the step of determining a voltage on the representative curve at the driving point comprises interpolating to the driving point the representative curve.

13. A method for determining the characteristic impedance of a line using time domain reflectometry on a printed wiring board comprising the steps of:

(a) selecting a driving point, the step of selecting a driving point further comprising determining an instant in time on a time domain reflectometry (TDR) waveform established while probing an open signal launch, the driving point being the instant in time and corresponds to a physical location denoting end of the signal launch;

(b) determining a voltage amplitude of incident step voltage at the time value that corresponds to the driving point;

(c) determining a voltage amplitude relative to the incident step voltage of a referee impedance standard at the time value that corresponds to the driving point;

(d) selecting an undisturbed region on a time domain reflectometry (TDR) waveform established while probing a transmission line, the step of selecting the undisturbed interval further comprising the step of determining an instant in time indicating end of the transmission line and selecting an interval of time within the driving point and the time indicating end of the transmission line as the undisturbed interval;

(e) measuring voltage at predetermined time intervals across the undisturbed region;

(f) determining from the measured voltages a line representative of such voltages; and (g) determining the line voltage on the line at the driving point; and (h) calculating the characteristic impedance of the transmission line by substituting the voltage determined in step (g) in the following equation:

$$Z_0 = Z_{reference} \frac{V_{incident} + V_{line} - V_{reference}}{V_{incident} + V_{line} + V_{reference}}$$

where $V_{incident}$ the voltage measured in step (b), $V_{line}$ is the voltage determined in step (g), $V_{reference}$ is the voltage measured in step (c), $Z_{reference}$ is the characteristic impedance of the referee impedance standard.

* * * * *